(12) United States Patent
Keite-Telgenbüscher

(10) Patent No.: US 9,399,723 B2
(45) Date of Patent: Jul. 26, 2016

(54) ELECTRICALLY CONDUCTIVE ADHESIVE COMPOUND AND ADHESIVE TAPE

(75) Inventor: Klaus Keite-Telgenbüscher, Hamburg (DE)

(73) Assignee: tesa SE, Norderstedt (DE)

(*) Notice: Subject to any disclaimer, the term of this patent is extended or adjusted under 35 U.S.C. 154(b) by 279 days.

(21) Appl. No.: 14/236,249

(22) PCT Filed: Jul. 10, 2012

(86) PCT No.: PCT/EP2012/063470
§ 371 (c)(1),
(2), (4) Date: Mar. 27, 2014

(87) PCT Pub. No.: WO2013/020767
PCT Pub. Date: Feb. 14, 2013

(65) Prior Publication Data
US 2014/0216654 A1    Aug. 7, 2014

(30) Foreign Application Priority Data
Aug. 10, 2011 (DE) .................. 10 2011 080 729

(51) Int. Cl.
| | |
|---|---|
| *C09J 7/02* | (2006.01) |
| *C09J 9/02* | (2006.01) |
| *C09J 7/00* | (2006.01) |
| *C09J 11/04* | (2006.01) |
| *C09J 133/08* | (2006.01) |
| *H01L 23/00* | (2006.01) |
| *C08F 220/18* | (2006.01) |
| *C08K 3/04* | (2006.01) |
| *C08K 3/08* | (2006.01) |
| *C08K 7/06* | (2006.01) |

(52) U.S. Cl.
CPC .............. *C09J 7/0207* (2013.01); *C08F 220/18* (2013.01); *C09J 7/00* (2013.01); *C09J 9/02* (2013.01); *C09J 11/04* (2013.01); *C09J 133/08* (2013.01); *H01L 24/29* (2013.01); *H01L 24/83* (2013.01); *C08K 3/04* (2013.01); *C08K 3/08* (2013.01); *C08K 7/06* (2013.01); *C09J 2201/602* (2013.01); *C09J 2201/606* (2013.01); *C09J 2203/326* (2013.01); *C09J 2205/102* (2013.01); *C09J 2421/00* (2013.01); *C09J 2433/00* (2013.01); *H01L 2224/2929* (2013.01); *H01L 2224/29347* (2013.01); *H01L 2224/29499* (2013.01); *H01L 2224/83815* (2013.01); *H01L 2224/83851* (2013.01); *H01L 2224/83905* (2013.01); *H01L 2924/01322* (2013.01); *H01L 2924/12041* (2013.01); *H01L 2924/12044* (2013.01); *H01L 2924/181* (2013.01); *Y10T 428/2857* (2015.01)

(58) Field of Classification Search
CPC .......... C09J 7/0207; C09J 133/08; C09J 7/00; C09J 11/04; C09J 9/02; C08F 220/18; H01L 24/29; H01L 24/83; H01L 2924/12044; H01L 2929/181; H01L 2924/12041; H01L 2924/01322; Y10T 428/2857
USPC .......................................................... 156/325
See application file for complete search history.

(56) References Cited

U.S. PATENT DOCUMENTS

| | | | |
|---|---|---|---|
| 4,533,685 A * | 8/1985 | Hudgin ................... C08K 3/08 252/512 |
| 4,882,227 A | 11/1989 | Iwase et al. | |
| 5,082,595 A | 1/1992 | Glackin | |
| 5,300,340 A | 4/1994 | Calhoun et al. | |
| 5,433,892 A | 7/1995 | Czech | |
| 5,463,190 A | 10/1995 | Carson et al. | |
| 5,494,730 A | 2/1996 | Calhoun et al. | |
| 5,554,678 A | 9/1996 | Katsumata et al. | |
| 6,013,376 A | 1/2000 | Yenni, Jr. | |
| 6,344,157 B1 | 2/2002 | Cheng et al. | |
| 6,573,322 B1 | 6/2003 | Sakakibara et al. | |
| 8,173,250 B2 | 5/2012 | Greiner et al. | |
| 8,460,969 B2 | 6/2013 | Krawinkel et al. | |
| 2005/0282002 A1 | 12/2005 | Husemann et al. | |
| 2006/0247352 A1 | 11/2006 | Bormashenko et al. | |
| 2007/0158617 A1 | 7/2007 | Greiner et al. | |
| 2008/0196831 A1 | 8/2008 | Friese et al. | |
| 2010/0038025 A1 | 2/2010 | Keite-Telgen-Buescher et al. | |
| 2010/0068514 A1 | 3/2010 | Ellinger et al. | |
| 2011/0121356 A1 | 5/2011 | Krawinkel et al. | |

(Continued)

FOREIGN PATENT DOCUMENTS

| | | |
|---|---|---|
| CN | 1373480 A | 10/2002 |
| CN | 101495587 A | 7/2009 |
| CN | 101942287 A | 1/2011 |

(Continued)

OTHER PUBLICATIONS

International Preliminary Report on Patentability and Written Opinion of corresponding PCT Application No. PCT/EP2012/063470 dated Feb. 20, 2014.

(Continued)

*Primary Examiner* — Daniel Lee

(74) *Attorney, Agent, or Firm* — Norris McLaughlin & Marcus, P.A.

(57) ABSTRACT

A pressure-sensitive adhesive composition comprising a) a polymer-metal blend comprising at least one pressure-sensitive adhesive and at least one metal component melting in the temperature range from 50° C. to 400° C., and b) at least one fibrous, electrically conductive filler, the filler being present at least partly in the form of a bound fiber network with the metal component.

16 Claims, No Drawings

(56) References Cited

U.S. PATENT DOCUMENTS

| | | |
|---|---|---|
| 2012/0177930 A1 | 7/2012 | Henckens |
| 2012/0228013 A1 | 9/2012 | Matienzo et al. |

FOREIGN PATENT DOCUMENTS

| | | |
|---|---|---|
| CN | 102471651 A | 5/2012 |
| DE | 10162613 A1 | 6/2003 |
| DE | 69902957 T2 | 9/2003 |
| DE | 10259549 A1 | 7/2004 |
| DE | 102004029589 A1 | 12/2005 |
| DE | 102007007617 A | 8/2008 |
| DE | 102008047964 A1 | 3/2010 |
| DE | 102008060113 A1 | 7/2010 |
| EP | 0154654 A1 | 9/1985 |
| EP | 0561854 A1 | 9/1993 |
| EP | 0942436 A1 | 9/1999 |
| EP | 1475424 A1 | 11/2004 |
| EP | 1695358 A1 | 8/2006 |
| EP | 1956063 A2 | 8/2008 |
| EP | 2042580 A1 | 4/2009 |
| JP | H031388808 A | 6/1991 |
| JP | 2001291431 A | 10/2001 |
| KR | 102001032872 A | 4/2001 |
| WO | 9839781 | 9/1998 |
| WO | 2005057590 A1 | 6/2005 |
| WO | 2007087281 A1 | 8/2007 |
| WO | 2008014169 A1 | 1/2008 |
| WO | WO 2008014169 A1 * | 1/2008 ........... C09J 133/066 |
| WO | 2011003948 A2 | 1/2011 |

OTHER PUBLICATIONS

Chinese Office Action for corresponding CN Application No. 201280049583.6 dated Dec. 31, 2014.

Chinese Office Action for corresponding CN Application No. 201280049583.6 dated Sep. 6, 2015.

Chinese Office Action for corresponding CN Application No. 201280049384.5 dated Aug. 5, 2015.

International Search Report for co-pending U.S. Appl. No. 14/236,269 for related PCT Application No. PCT/EP2012/063465 dated Jan. 31, 2013.

German Search Report for co-pending U.S. Appl. No. 14/236,269 for related German Application No. 10 2011 080 724.1 dated Mar. 27, 2012.

International Search Report of corresponding PCT Application No. PCT/EP2012/063470 dated Jan. 30, 2013.

German Search Report for related German Application No. 10 2011 080 729.2 dated Mar. 27, 2012.

* cited by examiner

ELECTRICALLY CONDUCTIVE ADHESIVE COMPOUND AND ADHESIVE TAPE

This application is a 371 application of PCT/EP2012/063470 filed Jul. 10, 2012, which claims foreign priority benefit under 35 U.S.C. §119 of German Application No. DE 10 2011 080 729.2 filed Aug. 10, 2011.

The invention relates to electrically conductive, pressure-sensitive adhesives and adhesive tapes with outstanding conductivity.

For numerous applications of plastics within electronics and electrical engineering, the components employed are required to exhibit electrical and/or electromagnetic and/or thermal conductivity, for the plastics parts used as well. Nowadays there are a multiplicity of plastics compounds, admixed with conductive fillers, which cover a volume resistivity range from $10^{10}$ Ω·cm to $10^{-1}$ Ω·cm. Electrically conducting fillers used are, for example, carbon black, carbon fibers, metal particles, metal fibers, or intrinsically conductive polymers.

To impart conductivity to an insulator such as plastic, conductive pathways through the plastic are created by means of the electrically conductive fillers, meaning that, ideally, the conductive particles contact one another. It is known that a conducting network in the plastic is optimally realizable by the introduction of metal fibers or carbon fibers. In this case, the longer the fiber, the smaller the weight fraction of the fibers required for a defined conductivity. With increasing fiber length, however, processing becomes more problematic as well, because of the sharp increase in the viscosity of the compounded formulation. Compounded formulations available on the market, with a steel fiber length of 10 mm, for instance, can be processed by injection molding only up to a maximum fiber weight fraction of around 25% to 30%. Using shorter fibers, compounded formulations with higher fiber weight fractions can still be processed by injection molding, but this—by comparison with the long fiber—does not bring any reduction in the volume resistivity. Similar behavior is found for thermoplastics filled with carbon fiber and with metal particles.

Another problem is that owing to differences in coefficients of expansion, the fiber network in the filled thermoplastics widens under the effect of temperature, causing interruption to the conductive pathways.

Also known art is the incorporation into polymer melts of low-melting metal alloys, involving melting of these alloys, to produce polymer-metal blends. Such blends are incorporated as injection-molded or extruded conductor tracks into electronic components.

U.S. Pat. No. 4,533,685 A, for instance, discloses polymer-metal blends which are produced by jointly melting polymer with low-melting metal alloy. Polymers described are a multiplicity of elastomers, thermoplastics, and curable polymers (thermosets), without any preferred selection being made. There is no reference in that specification to use as a pressure-sensitive adhesive.

In that specification the polymer-metal blends are processed to compression moldings possessing a thickness of around 6 mm, or are injection-molded. Additionally presented is an embodiment in which a polyurethane composition is drawn to a film, with the metal domains being highly oriented, resulting only in anisotropic conductivity.

A disadvantage of these systems is the need to form a blend with a continuous metallic phase in order to achieve high conductivity. The latter is achieved only for a metal fraction of 50 vol %. Below this fraction, lower conductivities are in fact achieved, but require the chance development of conductive pathways, meaning that the system offers no significant advantage over particle-filled systems.

Where a continuous metal phase is present, the material essentially also takes on the mechanical properties of the metal, implying, for example, a low elasticity and deformability. Under load, the metal structures easily break and the conductivity falls. Such structures therefore cannot be rationally used as a pressure-sensitive adhesive. The addition of metallic fillers (powders, fibers, or platelets) for the purpose of increasing the conductivity is a subject of general description, but without any concrete selection being made.

U.S. Pat. No. 4,882,227 A describes an electrically conductive resin mixture incorporating a low-melting metal alloy and also conductive fibers. The resin, however, is coated superficially onto the fiber-metal mixture and then formed into pellets. In substantial parts, therefore, the surface of the mixture is not conductive. No isotropically conductive blend structure is produced.

The polymers used therein are typical engineering thermoplastics which the skilled person in this context would not consider for the production of pressure-sensitive adhesives.

There is disclosure, furthermore, to the effect that in the resin described, the fraction of conductive fibers must not exceed 30 wt %, since otherwise the fluidity and hence the processing qualities of the resin would be severely degraded. This limits the attainable conductivity.

Only in a second step are the pellets produced incorporated as a masterbatch into a polymer melt of one of the abovementioned polymers, and dispersed. The further "dilution" of the conductive components reduces the overall conductivity, meaning that application is viewed in the EMI shielding segment (shielding against electromagnetic interference), where a conductivity in the range from $10^{-2}$ to $10^2$ S/cm is sufficient.

U.S. Pat. No. 5,554,678 A likewise describes a composition which is sufficiently conductive for shielding purposes and comprises metal fibers, a low-melting metal alloy, and carbon fibers additionally. Here again, the polymer basis stated comprises typical engineering thermoplastics which the skilled person would not consider for the production of pressure-sensitive adhesives. First of all, again, a masterbatch is produced and pelletized. Further processing is preferably by injection molding. Also described is processing by injection molding to form sheets, with subsequent shaping. From this mode of further processing it is evident that the stated acrylates are used not as pressure-sensitive adhesives but rather as acrylate-based molding compounds.

EP 942 436 B1 discloses an electrically conducting resin compound comprising a zinc-based metal powder, a low-melting metal (selected from the group consisting of tin and of tin-metal alloys which are melted at the time of a shaping operation), and a synthetic resin material. Here, in comparison to the specifications described above, the metal fibers are replaced by particles. This is preferable in order to improve the flow properties and hence the capacity for processing by injection molding. Here again, the resin compound is first of all pelletized, before being processed further by injection molding. In accordance with the selection of materials and with the processing technology, the skilled person would not employ this specification for the purpose of producing electrically conductive pressure-sensitive adhesives.

EP 1 695 358 B1 proposes a metal-plastic hybrid which comprises a thermoplastic, a lead-free metal compound melting in the range between 100° C. and 400° C., in an amount of 20 to 50 wt %, and copper fibers, in an amount of 30 to 70 wt %.

As its thermoplastic component, the metal/plastic hybrid comprises commodity plastics such as a polystyrene (PS) or a polypropylene (PP), engineering thermoplastics such as polyamide (PA) or polybutylene terephthalate (PBT), or high-temperature thermoplastics. Blends or thermoplastic elastomers are also specified. There is no reference to pressure-sensitive adhesives. The hybrids are used for producing moldings by injection molding.

Electrically conductive pressure-sensitive adhesives are also known fundamentally.

Thus, in the case of isotropically electrically conductive pressure-sensitive adhesives, their conductivity is produced by filling them with an electrically conductive filler. The level of filling in this case is selected such that filler percolation occurs—that is, conductive pathways for the electrical current are produced as a result of a small distance between the filler particles, or through direct contact. An example of this principle is described by US 1990-472950 A.

The surface conductivity is often supported by a layer of a conductive material (for example, metal foil or metal mesh, metalized sheet or nonwoven web). A disadvantage of such products, however, is a low level of conformity to rough substrates, the surface insert resulting in a loss of flexibility.

Further isotropically conductive pressure-sensitive adhesives are based on pressure-sensitively adhesive gels (for example, EP 561 854 B1). For industrial applications, however, these adhesives generally lack sufficient cohesiveness, and are therefore used for the temporary bonding of electrodes on skin.

In the case of anisotropically conductive adhesive sheets, the surface conductivity is prevented by various measures, leaving generally only a conductivity perpendicular to the surface. A principle of this kind is shown in US 1992-874553 A, for example. Widespread is the filling of the adhesive with a filler whose particle diameter is larger than the layer thickness of the sheet, with the level of filling remaining below the percolation threshold.

Another class of pressure-sensitive adhesive sheets is conductive only at the surface, but not perpendicular to the surface. This is achieved by the insertion of a conductive layer between layers of nonconductive adhesive.

Especially in the case of isotropically conductive pressure-sensitive adhesives, it is difficult to attain sufficiently high conductivity in conjunction with high bonding performance, since increasing level of filling lowers the active bonding area that is available. One commonplace concept, therefore, is to minimize the required level of filling through skilful selection of a filler or combination of fillers. For this purpose, for example, highly conductive metals such as silver, copper, or gold, and also forms of electrically conductive fillers that are varied in terms of their aspect ratio, such as fibers or platelets (including those on a micrometer or nanometer scale) for example, are used. Particularly noteworthy here are silver fibers, copper fibers, silver-coated mica flakes, or phyllosilicates, and also carbon nanotubes and graphene.

A further disadvantage of the known, filler-containing, electrically conductive, pressure-sensitive adhesives is that the conductive pathways formed can easily be broken by thermally or mechanically induced stretching of the system, resulting in a drop in conductivity.

It was an object of the invention, then, to provide a pressure-sensitive adhesive (PSA) which is improved, which has substantially isotropic conductivity, and which unites high bond strength with high electrical conductivity. A further aim is to provide a corresponding pressure-sensitive adhesive tape. The adhesive tape is also to be flexible and to exhibit no drop in conductivity through stretching.

The achievement of this object has been found through a pressure-sensitive adhesive composition which comprises at least one polymer-metal blend and at least one—more particularly fibrous—electrically conductive filler. In accordance with the invention, the polymer-metal blend in turn comprises at least one pressure-sensitive adhesive, which more particularly may be a PSA as known per se from the prior art, and also at least one metal component melting in the temperature range from 50° C. to 400° C. The filler here is present in the form of a bound fiber network with the metal component.

"Metal component melting in the temperature range from 50° C. to 400° C." means that for metal components with a melting point, the melting point is within the stated range, and for metal components—more particularly metal alloys—having a melting range, the lower limit of this melting range is greater than or equal to 50° C. and the upper limit of this melting range is less than or equal to 400° C. The figures for melting points and limits of the melting range of the metal components relate to the dynamic measurement in accordance with DIN 51004 with a heating rate of 10° C./min.

"Bound fiber network" means more particularly that the fibers are present in a form bound to one another by the metal and are not merely present in mechanical contact with one another. In particular, individual sections of the fibers may be bound, by melting, for example, into different regions of the metallic phase, meaning that continuous conduction pathways are present.

Surprisingly it has been possible in this way to produce PSAs which for a low level of filling combine high conductivity and high bond strength. As a result of the high affinity of the metal blends for the filler, and its fibrous geometry, a conductivity sufficient for many applications is surprisingly achieved even at lower levels of filling than in the case of pure particle filling. The pressure-sensitive adhesive properties of a PSA of the invention are therefore improved, as a result of the increased area of contact with the bond substrate.

One advantage of the invention is that the fibers are contacted with one another by the metal compound present, and therefore high conductivities are achieved even for comparatively low levels of filling. Moreover, the synergistic effect described above means that high bond strengths are achieved even when conductivities are high.

Pressure-sensitive adhesives (PSAs) are, in particular, polymeric compositions which—optionally by means of suitable additization with further components, such as tackifying resins, for example—are durably tacky at the application temperature (room temperature unless otherwise defined) and—disregarding any aging processes that may occur—are permanently adhesive and adhere on contact to a multiplicity of surfaces, more particularly undergoing instantaneous adhesion (exhibiting what is called "tack" [adhesiveness, or contact adhesiveness]). Even at the application temperature they are capable, without activation by solvent or by heat—but typically as a result of the influence of a more or less high pressure—of wetting a substrate on which bonding is to take place, to an extent such that interactions sufficient for adhesion are able to develop between the adhesive and the substrate.

By means of suitable cohesion-boosting measures, such as crosslinking reactions (formation of bridge-forming linkages between the macromolecules), for example, it is possible to expand and/or shift the temperature range within which a polymer compound exhibits pressure-sensitive adhesive properties. The sphere of application of the PSAs can therefore be optimized by adjustment between fluidity and cohesion of the adhesive.

PSAs can be produced in principle on the basis of polymers of a variety of chemical natures. The pressure-sensitive adhesion properties are influenced by factors including the nature and the proportions of the monomers employed for the polymerization of the PSA's parent polymers, their average molar mass and molar-mass distribution, and the nature and amount of the additives to the PSA, such as tackifying resins, plasticizers, and the like.

As PSA it is presently possible in principle to use all PSAs known to the skilled person.

PSAs selected in accordance with the invention are, in particular, those based on natural rubbers and/or synthetic rubbers, those based on silicones and/or those based on acrylates and/or methacrylates.

"Based on" means in the present context that the properties of the PSA are determined at least heavily by the fundamental properties of this polymer (the so-called "base polymer"). In particular this may mean that the fraction of the base polymer as a proportion of the total mass of the polymeric phase amounts to more than 50 wt %. The PSA may comprise other polymers and/or oligomers. In particular, the use of resinous tackifiers (tackifying resins) may be advantageous in order to adjust the properties of the PSA. The PSA may be admixed with modifying auxiliaries or additives (examples being plasticizers, aging inhibitors, fillers, foaming agents, and the like).

As PSA for the polymer-metal blend it has emerged as being particularly advisable to use polyacrylate PSAs—that is, PSAs based on monomers from the group encompassing acrylic acid, methacrylic acid, acrylic esters, methacrylic esters, and further (co)polymerizable acrylic esters and methacrylic esters (referred to collectively below as "acrylic monomers").

Polyacrylate PSAs suitable in accordance with the invention may be straight acrylate systems, thus based exclusively on acrylic monomers, but may also include further copolymerized comonomer units. The corresponding comonomers which form the basis for these units may be, in particular, vinyl monomers having at least one copolymerizable double bond. Suitable comonomers are, for example, maleic anhydride, styrene, styrene compounds, vinyl acetate, acrylamides, and photoinitiators functionalized with double bond.

The comonomers may be utilized in order to adjust the properties of the PSA. One factor influencing the behavior of the PSAs is the glass transition temperature of the polymer, which can be regulated through the monomer composition. The comonomers can be used specifically, accordingly, to regulate the glass transition temperature of the copolymer that constitutes the basis for the PSA. By means of the comonomers, furthermore, it is also possible to introduce functional groups which can likewise be utilized for regulating the properties of the PSA (through introduction of polar groups, for example) and/or, for example, for a crosslinking reaction or a curing reaction.

With particular advantage the polyacrylate PSAs have, to some extent at least, acid groups, which have been introduced into the polymer with the acrylic monomers, modified accordingly where appropriate, and/or with comonomers containing acid groups (more particularly vinyl monomers). Through acid groups in particular it is possible to bring about targeted regulation of the properties of the PSA within a wide range in a particularly simple way, more particularly the cohesive and/or adhesive properties thereof, for instance. This is further enhanced by the possibility of being able additionally to adapt the properties through use of other suitable comonomers.

An advantage offered by polyacrylate PSAs is that they are particularly easy to blend in the melt with the metal alloy and the filler and can subsequently be applied from the melt, thus greatly simplifying further processing when using these systems. A further advantage of polyacrylate PSAs is that they are particularly stable to aging and therefore have the capacity for long-term stability with respect to electron transport processes. Having emerged as being especially advantageous in this context are polymers additionally containing comonomers with acid groups, since they support the conductivity.

Selected with great advantage in accordance with the invention, as base polymers of the PSA, are polyacrylates of the kind obtainable, for instance, by radical polymerization, and based at least partly on at least one acrylic monomer of the general formula $CH_2=C(R^1)(COOR^2)$, where $R^1$ is H or a $CH_3$ radical and $R^2$ is selected from the group encompassing hydrogen and the saturated, unbranched or branched, substituted or unsubstituted $C_1$ to $C_{30}$ alkyl radicals (advantageously the $C_2$ to $C_{20}$ alkyl radicals, preferably the $C_4$ to $C_{14}$ alkyl radicals, more preferably the $C_4$ to $C_9$ alkyl radicals).

Specific examples, without wishing to be confined by this enumeration, are methyl acrylate, methyl methacrylate, ethyl acrylate, n-butyl acrylate, n-butyl methacrylate, n-pentyl acrylate, n-hexyl acrylate, n-heptyl acrylate, n-octyl acrylate, n-octyl methacrylate, n-nonyl acrylate, lauryl acrylate, stearyl acrylate, behenyl acrylate, and their branched isomers, examples being isobutyl acrylate, 2-ethylhexyl acrylate, 2-ethylhexyl methacrylate, isooctyl acrylate, isooctyl methacrylate, cyclohexyl methacrylate, isobornyl acrylate, isobornyl methacrylate, and 3,5-dimethyladamantyl acrylate.

Having also emerged as being PSAs that can be used outstandingly in accordance with the invention are those based on synthetic rubbers. These include, in particular, PSAs based on polyisobutylene (FIB), of the kind described in WO 2007/087281 A1 or in DE 10 2008 060 113 A1, for example; those PSAs based on block copolymers containing on the one hand polymer blocks formed predominantly of vinylaromatics (A blocks) and on the other hand polymer blocks formed predominantly by polymerization of 1,3-dienes (B blocks); and those PSAs based on semicrystalline polyolefins, of the kind described in DE 10 2008 047 964 A1, for example. The PSAs listed therein are notable for particularly low water vapor permeation and low water content, meaning that corrosion processes within the electrically conductive PSA and at the contacted interface are reduced.

Generally speaking, PSAs with a water vapor permeation of less than 50 g/m²d (determined in accordance with ASTM F-1249 at 38° C. and 90% relative humidity for a layer thickness of 50 μm) are preferred for reducing corrosion-related conductivity losses.

Additionally preferred are PSAs with a water content of less than 5000 ppm, more particularly less than 1000 ppm, determined after 72 h of conditioning at 23° C. and 50% relative humidity by means of Karl Fischer titration (baking temperature 150° C.).

As a low-melting metal component, low-melting metals may be used, such as, for example, zinc, tin, or else, in principle, lead. With preference in accordance with the invention in particular, however, use may be made of low-melting metal alloys. The metal component comprises essentially one or more metals, but may also include any desired adjuvants, including in particular nonmetallic adjuvants and additives.

A low-melting metal alloy is a metallic compound whose melting point or melting range lies between 50° C. and 400° C., preferably between 100° C. and 300° C. Not only low-melting metal alloys with a melting range but also those with a melting point may be used in accordance with the invention.

A feature of the low-melting metal alloy with melting point is an immediate and drastic drop in viscosity to <50 mPa·s when the melting point is exceeded. This extremely low, almost waterlike viscosity makes a decisive contribution in the adhesive tape to the flow of the metal alloy onto the substrate to be contacted, when the pressure-sensitive adhesive tape is exposed thermally with a temperature above the melting temperature of the metal alloy. In the case of a low-melting metal alloy (solder compound) with a melting range, the viscosity drops continuously within the melting range and reaches a value <50 mPa·s only after the melting range has been exceeded. In accordance with the invention it is possible to use not only low-melting metal compounds having a melting point but also those having a melting range. Preferred are metal alloys with a melting range, since the broader temperature range of solidification results in a rheological behavior more similar to the adhesive, thereby facilitating the extrusion of thin sheets, and especially their stretching in the extrusion operation. Metal alloys of these kinds with a broad melting range are generally found in the hyper- or hypoeutectic mixing range of the alloy.

Preferred on the other hand are eutectic alloys, since in this case separation phenomena are reduced and there are fewer instances of adhesion to the surfaces of the compounding and shaping tools.

Preference is given to the use of low-melting metal compounds which are free from heavy metal, more particularly those which are lead-free, and are thus unobjectionable from the standpoint of toxicology. Low-melting metal compounds employed by way of example also at least include tin, zinc and/or bismuth.

Depending on what the requirement is, the fractions of low-melting metal alloy and electrically conductive fillers may be varied within a wide range, generally in sum total between 10 to 99 wt %, more particularly between 30 and 95 wt % and between 40 and 90 wt %. For attainment of the maximum conductivity it has been found that the fraction of the low-melting metal alloy ought to be between 20 and 60 wt %, advantageously between 25 and 40 wt %, and with more particular preference between 27 and 35 wt %. The fraction of conductive filler(s) is preferably between 20 and 80 wt %, with more particular preference between 30 and 70 wt %, and with more particular preference between 35 and 65 wt %.

In this way it is possible to achieve volume resistivities of $<10^{-3}$ Ω·cm. It is also readily possible to attain high thermal conductivities >0.5 W/mK. The conductivity requirements (electrical/thermal) are guided by the field of use for the adhesive film, and may vary within wide limits. The statement of the conductivities is not, however, intended to confine the invention in any way.

As electrically conducting filler it is possible to use all customary and suitable materials, as for instance aluminum, copper, silver, gold, nickel, mu-metal, alnico, permalloy, ferrite, carbon nanotubes, graphene, and the like. This electrically conducting filler favorably has an electrical conductivity of more than 20 MS/m (corresponding to a resistivity of less than 50 mΩmm$^2$/m), more particularly of more than 40 MS/m (corresponding to a resistivity of less than 25 mΩ·mm$^2$/m), in each case determined for 300 K.

Preferred is the use of copper and nickel, which may also be present only as a coating on the surface of other materials. These metals display better compatibility with the low-melting metal alloys used, thereby improving the electrical contact. Especially preferred are coppered or nickeled aluminum fibers which as well as their high conductivity and the high compatibility resulting from the surface coating, also afford the advantage of a low weight. Such fibers are available, for example, from IKI Global Inc., Korea. Further preferred are copper-coated or nickel-coated carbon fibers, as available, for example, from Sulzer-Metco, Switzerland, under the E-Fill tradename.

The filler is considered fibrous when the aspect ratio, this being the ratio between greatest longitudinal extent and, orthogonally with respect to the latter, smallest longitudinal extent, is at least 3, preferably at least 10.

For a dense and therefore rigid network which presents a high resistance to deformation in the case of heat-activated bonding and which therefore allows the application of high contacting forces, a fiber length of between 0.1 and 0.9 mm is preferred.

For a loose and hence elastic network, which makes the pressure-sensitive adhesive tape flexible and therefore allows improvements in appliability and in adaptation to curved substrates, a length of the fiber in the range from 1 to 10 mm is preferred.

Depending on application, it is also advantageous to use a mixture of at least two electrically conductive fillers, with at least one of the electrically conductive fillers being fibrous, although two or more of the electrically conductive fillers, and more particularly all electrically conductive fillers, may also be fibrous.

Besides the ingredients described, the PSA composition may be admixed with further additives which provide a beneficial influence on its preparation and/or its properties. These additives may be for example, but not conclusively, dispersing additives, flow assistants, such as waxes or silicones, for example, compatibility improvers, adhesion promoters, wetting agents, solder fluxes, or intrinsically conductive polymers.

The PSA composition may be produced in a variety of ways familiar to the skilled person. Preference is given to the production of a compounded formulation in melt form, composed of PSA, filler, and metal alloy. The compounded formulation is advantageously produced and processed at a temperature at which both the low-melting metallic alloy and the adhesive are present in the liquid melt state.

In order to prevent excessive increase in the viscosity, it is possible to add viscosity-lowering adjuvants, such as waxes, for example.

The compounded formulation can be produced either discontinuously in a compounder for example or else continuously in an extruder, for example, especially advantageously in a twin-screw extruder or in a continuous compounder, as for example from Buss (Pratteln, Switzerland).

The adhesive composition of the invention is used particularly as an adhesive tape. In the text below, the term "pressure-sensitive adhesive tape" is understood to include all sheet-like pressure-sensitive adhesive products, irrespective of whether one areal dimension (x-direction) is significantly greater than its perpendicular counterpart areal dimension (y-direction), in other words adhesive tapes, adhesive sheets, adhesive-tape sections, and the like, according to the common terminological usage.

The invention therefore likewise provides an adhesive tape comprising at least one layer of a pressure-sensitive adhesive composition as described in the context of the specification, more particularly as claimed in any of the claims.

These adhesive tapes of the invention
  may be of single-layer construction, thus formed only by the layer of the PSA composition of the invention ("adhesive transfer tapes");
  they may be of two-layer construction, for instance as a single-sidedly pressure-sensitive adhesive tape (layer of the PSA composition of the invention on a further, nonadhesive layer, more particularly a carrier layer)

or as a two-sidedly pressure-sensitive adhesive tape (layer of the PSA composition of the invention on another PSA layer);

or they may be three-layer or multilayer, for instance as a single-sidedly pressure-sensitive adhesive tape (layer of the PSA composition of the invention externally on other layers, the second external layer being nontacky)

or as a two-sidedly adhesive tape having at least one internal layer, more particularly a carrier layer, and two external PSA layers, of which only one is formed by the PSA composition of the invention, or which are both formed by the PSA composition of the invention.

The PSAs of the invention can be used outstandingly to produce an electrically conducting, in particular single-layer sheetlike element in the sense of the above-described adhesive transfer tape. A sheetlike element for the purposes of this specification encompasses in particular all customary and suitable structures having substantially two-dimensional extent. The structures may take various forms, more particularly flexible, in the form of a sheet, tape, label, or in the form of a diecut.

The sheetlike element may be produced from the compounded formulation, more particularly the compounded formulation in melt form, by means, for example, of spreading out, coating, extruding, rolling, pressing, or stretching.

The sheetlike element may have a thickness of the kind customary in the field of single-layer pressure-sensitive adhesive tapes, in other words approximately between 1 µm and 1000 µm. A thickness of 10 to 50 µm is preferred if the conductivity within the plane of the sheetlike element is less significant to the application. In this way a saving can be made on material, and the length of the distance to be conductively bridged by the sheetlike element can be kept low. If the conductivity within the plane is highly important, then a sheetlike element thickness of 200 to 500 µm is preferred, since in this way a greater cross-sectional area and hence a higher conductivity are provided. A preferred compromise between both extremes is a thickness of 50 to 200 µm.

The sheetlike element may additionally be lined on one or both sides with a release liner.

In one particular embodiment, the sheetlike element may be provided with a complete or perforated electrically conductive layer. This layer may be disposed on at least one side of the sheetlike element, or within the sheetlike element, meaning that PSA is located on both sides of the electrically conductive layer. Such a layer advantageously raises the conductivity of the sheetlike element within the plane.

All customary and suitable materials can be used as an electrically conducting layer, for instance aluminum, copper, silver, gold, nickel, mu-metal, alnico, permalloy, ferrite, carbon nanotubes, graphene, intrinsically conducting polymers, indium tin oxide, and the like. This electrically conducting layer advantageously has an electrical conductivity of more than 20 MS/m (corresponding to a resistivity of less than 50 mΩ·mm$^2$/m), more particularly of more than 40 MS/m (corresponding to a resistivity of less than 25 mΩ·mm$^2$/m), in each case determined for 300 K.

The layer is advantageously in a perforated form, for instance as punched lattice, wire mesh, expanded metal, or nonwoven web, or in the form of a pattern printed or deposited by other conventional techniques, including vacuum techniques such as vapor deposition.

The shape of the pressure-sensitively adhesive sheetlike element may be that of a web or sheet. This form may more particularly be adapted to the geometry of the bond area, such that the film of adhesive takes the form, for instance, of a film cut to size and shape or of a diecut. This means more particularly that the form corresponds approximately or exactly to the shape of the joining areas of the components to be joined, and hence to the lateral form of the bonded joint. With sheetlike elements of these kinds, the dimensional stability and bond strength requirements are typically particularly high.

For applications where there is no requirement for isotropic conductivity, it is advantageous to align the fibers and/or the regions formed by the metal alloy (e.g., particles) in accordance with the desired preferential direction. This may be achieved, for example, by carrying out stretching when extruding pressure-sensitively adhesive sheetlike elements of the invention. The result is a greater conductivity in the plane of the pressure-sensitively adhesive sheetlike element. When magnetic fibers are used, made from nickel or nickel-coated materials, for example, it is possible with particular advantage to align the fibers by means of a magnetic field in tandem with heating. As a result of the reduced viscosity, such orientation can take place in this process and is fixed after cooling. Particularly advantageous is activation substantially perpendicular to the plane of the pressure-sensitively adhesive sheetlike element, since by this means the contacting of the substrates to be bonded is improved. The required magnets can easily be incorporated for this purpose into the tooling of a bonding press. Particularly advantageous for these processes is the use of magnetically coated carbon fibers, since their high stiffness makes them easier to orient.

The invention further provides a method for bonding an adhesive tape, more particularly a pressure-sensitively adhesive sheetlike element, on a substrate surface, and also a method for bonding two substrate surfaces to one another (which may be assigned to two different adherends, but may also belong to a single adherend with surfaces to be bonded that are disposed accordingly) by means of an adhesive tape, more particularly by means of a pressure-sensitively adhesive sheetlike element. With these methods, in each case, the bond is produced by means of such a layer of an adhesive composition, or such a layer of an adhesive composition makes a critical contribution to producing the bond, said composition comprising at least one polymer-metal blend and at least one fibrous electrically conductive filler, the polymer-metal blend in turn comprising at least one PSA and also at least one metal component melting in the temperature range from 50° C. to 400° C., and the filler being present at least partly in a bound fiber network with the metal component.

The PSA composition here is more particularly one as described in this specification and/or as apparent from any of the claims.

When joining takes place by means of the electrically conductive PSA of the invention, with application of a pressing force, the fiber network is elastically and/or plastically compressed and thus brought into intimate contact with the substrate. In contrast to conductive fillers present in free distribution in the adhesive, which flow during the pressurized joining operation with the viscoelastic PSA matrix, the network is deformed and in this way a contacting pressure is developed that leads to an enhanced and more permanent contacting of the substrate.

As observed above, it is not necessary to heat PSAs in order to bring about bonding. It is, nevertheless, of particular advantage if the PSA of the invention is heated during or after the application. In this way the PSA is able to flow on more effectively, and the bond strength increases as a result. The temperature in this case ought preferably to be more than 30° C., more preferably more than 50° C., in order to promote flowing-on accordingly. The temperature selected ought not, however, to be too high, so as not to melt the fiber network. As far as possible the temperature ought to be less than 120° C. Temperatures between 50° C. and 100° C. have proven to be an optimum temperature range.

The application temperature may alternatively be situated above the melting temperature of the low-melting metal alloy. Through the low-melting metal compound, surprisingly, during application with a temperature above the melting temperature of the metal compound, a solderlike contact is produced with the substrate to be contacted, this contact considerably improving the electrical transition, in comparison to particles merely touching one another, and also making a synergistic contribution to the strength of the bond, so that a strength is achieved which is above the bond strength anticipated on the basis of the average wetting area of the PSA.

In another advantageous method, a preliminary assembly of the sheetlike element with one of the adherends is formed first of all at a temperature below the melting temperature of the metal alloy. In this way it is possible to carry out preliminary fixing of a preshaped sheetlike element on an adherent part, for example. Then the other adherend is contacted with the other side of the sheetlike element. The pressure-sensitive adhesive properties result in immediate formation of an assembly, and so in a favorable case there is no need for further fixing of the adherends. In an onward development of this method, after or even during this final bonding to the adherend, a temperature is used that is above the melting temperature of the metal alloy, resulting in the synergistically boosted strength and enhanced electrical conductivity of the bond.

The article of the invention and the methods are employed preferably for the bonding of construction units of electronic appliances, such as, for instance, those from the area of consumer goods electronics, entertainment electronics, or communication electronics (for example, for cellphones, PDAs, laptops and other computers, digital cameras and display devices such as displays, digital readers, or organic light-emitting diode displays (OLEDs)), and also for solar cell modules (such as, for instance, silicon solar cells, electrochemical dye solar cells, organic solar cells or thin-layer cells), or electrochemical cells, such as electrolysis cells or fuel cells, for example. Assembly units are understood presently to include all constituents and collections thereof that are used in electronic appliances, examples being electronic components (discrete and integrated components), housing parts, electronic modules, antennas, display fields, protective plates, unpopulated and/or populated circuit boards, and the like.

EXAMPLES

The bond strength of pressure-sensitively adhesive sheetlike elements of the invention with an adhesive thickness of 200 μm was determined in a peel test at an angle of 180° and with a removal rate of 300 mm/min in accordance with ISO 29862:2007 (Method 3). All bonding, storing, and measuring procedures were carried out at room temperature (23° C.) under climatically controlled conditions (at 50% relative humidity). The peel test was carried out on three specimens 20 mm wide, the bond strength being determined after a bonding time/aging period of two weeks, the value reported here being the arithmetic mean.

The carrier material used was a polyester film etched on the surface for improved adhesive anchorage and 25 μm in thickness, of the kind obtainable from Coverne (Italy). The substrate used was a rolled brass plate 3 mm in thickness, which was cleaned with acetone before each measurement.

In order to measure the electrical conductivity, during bonding, brass foils 50 μm thick were used on both sides of the film of PSA, which was 200 μm thick, and circular test specimens were prepared by lamination at 23° C., having an area of 6.45 $cm^2$. The volume resistance was measured at room temperature (23° C.) and 50% relative humidity by analogy with ASTM D 2739, with an electrode pressing pressure of 76 kPa. The average value from three measurements is reported.

In deviation from this, in the case of selected examples, the bond was produced at an elevated application temperature in a heated roll laminator, at the particular temperature reported. Testing of the specimens, however, always took place under the conditions indicated above.

PSAs used were as follows:
Adhesive 1:
Pressure-sensitive acrylate adhesive containing as comonomers 30 wt % of ethylhexyl acrylate, 67 wt % of butyl acrylate, and 3 wt % of acrylic acid.

For the preparation of the acrylate PSA, the individual comonomers were polymerized in a mixture of benzine and acetone, in a manner known to the skilled person. The solvent was then removed from the resulting acrylate polymer material, by means of a devolatilizing extruder.

Fibrous fillers used were as follows:
Fiber 1: Copper fiber F08 (0.8 mm long, 60 μm thick) from Deutsches Metallfaserwerk, Neidenstein
Fiber 2: Copper fiber F3 (3 mm long, 180 μm thick) from Deutsches Metallfaserwerk, Neidenstein
Low-melting metal alloys used were as follows:
Metal 1: MCP 200 (melting point 199° C.) from HEK, Lübeck
Metal 2: MCP 62 (melting point 60° C.) from HEK, Lübeck
The following compounded formulations were produced (quantity figures in wt %):

| Example | PSA [wt %] 1 | PSA [wt %] 1 | Fiber [wt %] 1 | Fiber [wt %] 2 | Metal [wt %] 1 | Metal [wt %] 2 |
|---|---|---|---|---|---|---|
| 1 | 40 | | 20 | | 40 | |
| 2 | 20 | | 20 | | 60 | |
| 3 | 25 | | 35 | | 40 | |
| 4 | 5 | | 35 | | 60 | |
| 5 | 32.5 | | 27.5 | | 40 | |
| 6 | 12.5 | | 27.5 | | 60 | |
| 7 | 30 | | 20 | | 50 | |
| 8 | 15 | | 35 | | 50 | |
| 9 | 22.5 | | 27.5 | | 50 | |
| 10 | 15 | | 33 | | 52 | |
| 11 | 15 | | 40 | | 45 | |
| 12 | 15 | | 45 | | 40 | |
| 13 | 15 | | | 40 | 45 | |
| 14 | 15 | | | 45 | 40 | |
| 15 | 15 | | | 35 | 50 | |
| 16 | 15 | | 40 | | | 45 |
| V1 | 15 | | 85 | | | |
| V2 | 15 | | | | 85 | |

The compounded formulations were produced using a ZSK25 corotating twin-screw extruder from Coperion with an L/d ratio of 40. The temperature regime was selected in each case to bring about complete melting of PSA and metal alloy. In a first process zone, a blend of PSA and metal alloy was produced, to which the metal fibers were added in a second process zone. For the shaping of the PSA film of the invention, a flat film die was flanged directly onto the extruder, and a flat film with a thickness of 200 μm was extruded.

Surprisingly it transpired that the fiber fractions processable in the extrusion process were substantially higher than those known in the prior art.

Comparative example 1 was produced in a recording compounder from Haake, since the corresponding formulation was no longer extrudable. The compounded formulation produced in this way was used to produce pressed moldings with a thickness of 200 μm in a Laufer vacuum press.

The bond strengths and the electrical conductivities as well are set out in the table below:

|  | Application temperature [° C.] | Bond strength [N/cm] | Volume resistance [Ω · cm] | Remarks |
| --- | --- | --- | --- | --- |
| Example |  |  |  |  |
| 1 | 23 | 3.1 | 1.92E−01 |  |
| 2 | 23 | 1.9 | 1.41E−02 |  |
| 3 | 23 | 2.0 | 1.40E−02 |  |
| 4 | 23 | 1.2 | 4.16E−05 |  |
| 5 | 23 | 2.7 | 6.14E−02 |  |
| 6 | 23 | 1.5 | 1.71E−03 |  |
| 7 | 23 | 2.6 | 6.16E−02 |  |
| 8 | 23 | 1.9 | 1.70E−03 |  |
| 9 | 23 | 2.2 | 1.40E−02 |  |
| 10 | 23 | 1.9 | 2.02E−03 |  |
| 11 | 23 | 2.0 | 1.07E−02 |  |
| 12 | 23 | 2.0 | 6.44E−04 |  |
| 13 | 23 | 1.9 | 8.10E−03 |  |
| 14 | 23 | 2.2 | 1.01E−02 |  |
| 15 | 23 | 2.1 | 3.24E−03 |  |
| 16 | 23 | 2.9 | 3.17E−03 |  |
| 16a | 90 | >6 | 1.22E−03 | Cracking of the carrier material |
| Comparative example |  |  |  |  |
| C1 | 23 | 2.2 | 1.36E0 |  |
| C2 | 23 | 1.4 | 9.35E1 |  |

The examples show that the pressure-sensitively adhesive sheetlike elements of the invention with bound fiber network exhibit significantly increased conductivities as compared with the comparative examples, which are merely filled with fibers or particles. Keeping overall solids content the same while increasing the fiber fraction tends to result in higher conductivities and slightly increased bond strengths, this being attributed to the higher conductivity of the fibers and to the greater flexibility of the network.

Longer fibers lower the conductivity, this being attributed to the greater orientation into the plane of the extruded film. The conclusion from this is an increase in the conductivity in the plane (examples 13-15).

In examples 16 and 16a, where the low-melting metal alloy melts at the application temperature, the synergistic effect occurs of the simultaneous increase in strength of the bond and increase in conductivity. This is attributed to improved contacting of the substrate material.

The invention claimed is:

1. A pressure-sensitive adhesive composition comprising
   a) a polymer-metal blend comprising
      at least one pressure-sensitive adhesive, and
      at least one metal component melting in a temperature range from 50° C. to 400° C., and
   b) at least one fibrous, electrically conductive filler, wherein the filler is present, at least partly, in a form of a bound fiber network with the at least one metal component.

2. The pressure-sensitive adhesive composition according to claim 1, wherein the at least one metal component is a metal or a metal alloy.

3. The pressure-sensitive adhesive composition according to claim 1, wherein the pressure-sensitive adhesive is a pressure-sensitive polyacrylate adhesive.

4. The pressure-sensitive adhesive composition according to claim 1, wherein the pressure-sensitive adhesive is a pressure-sensitive rubber adhesive.

5. The pressure-sensitive adhesive composition according to claim 1, wherein at least one of the at least one fibrous, electrically conductive filler is metallic.

6. The pressure-sensitive adhesive composition according to claim 1, wherein at least one of the at least one fibrous, electrically conductive filler is a carbon modification or a carbon-containing chemical compound.

7. The pressure-sensitive adhesive composition according to claim 1, wherein at least one of the at least one fibrous, electrically conductive filler is magnetic.

8. The pressure-sensitive adhesive composition according to claim 1, wherein the pressure-sensitive adhesive has a layer thickness of 50 μm and a water vapor permeation of less than 50 g/m$^2$d at 38° C. and 50% relative humidity.

9. The pressure-sensitive adhesive composition according to claim 1, wherein the pressure-sensitive adhesive has a water content of less than 5000 ppm determined after 72 h of conditioning at 23° C. and 50% relative humidity by means of Karl Fischer titration.

10. The pressure-sensitive adhesive composition according to claim 9, wherein the pressure-sensitive adhesive has a water content of less than 1000 ppm determined after 72 h of conditioning at 23° C. and 50% relative humidity by means of Karl Fischer titration.

11. A pressure-sensitive adhesive tape comprising at least one layer of the pressure-sensitive adhesive composition according to claim 1.

12. The pressure-sensitive adhesive tape according to claim 11, further comprising a layer of a carrier material.

13. The pressure-sensitive adhesive tape according to claim 11, wherein the layer of a carrier material comprises an electrically conductive carrier material.

14. A method for adhesive bonding on a first substrate surface, the method comprising:
   bonding the first substrate surface with the pressure-sensitive adhesive composition according to claim 1 or the pressure-sensitive adhesive tape according to claim 11.

15. The method according to claim 14, further comprising bonding the first substrate surface to a second substrate surface, at a bond site, with the pressure-sensitive adhesive composition according to claim 1 or the pressure-sensitive adhesive tape according to claim 11.

16. The method according to claim 15, further comprising:
   heating the bond site, during or after the bonding operation, to a temperature above the melting temperature of the at least one metal component.

* * * * *